US008941432B2

(12) United States Patent
Sathe et al.

(10) Patent No.: US 8,941,432 B2
(45) Date of Patent: Jan. 27, 2015

(54) TRANSITIONING BETWEEN RESONANT CLOCKING MODE AND CONVENTIONAL CLOCKING MODE

(71) Applicant: Advanced Micro Devices, Inc., Sunnyvale, CA (US)

(72) Inventors: Visvesh S. Sathe, Fort Collins, CO (US); Srikanth Arekapudi, Sunnyvale, CA (US); Charles Ouyang, San Jose, CA (US); Kyle Viau, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/963,300

(22) Filed: Aug. 9, 2013

(65) Prior Publication Data
US 2014/0062566 A1    Mar. 6, 2014

Related U.S. Application Data

(60) Provisional application No. 61/695,702, filed on Aug. 31, 2012.

(51) Int. Cl.
*H03K 3/00* (2006.01)
*H03K 3/57* (2006.01)
*G06F 1/04* (2006.01)

(52) U.S. Cl.
CPC ... *H03K 3/57* (2013.01); *G06F 1/04* (2013.01)
USPC .......................................................... 327/304

(58) Field of Classification Search
USPC .......................................................... 327/304
See application file for complete search history.

(56) References Cited

U.S. PATENT DOCUMENTS

| 6,025,738 | A | 2/2000 | Masleid |
|---|---|---|---|
| 6,088,250 | A | 7/2000 | Siri |
| 6,205,571 | B1 | 3/2001 | Camporese et al. |
| 6,310,499 | B1 | 10/2001 | Radjassamy |
| 6,882,182 | B1 | 4/2005 | Conn et al. |
| 7,082,580 | B2 | 7/2006 | Zarkesh-Ha et al. |
| 7,084,685 | B2 | 8/2006 | Lin et al. |
| 7,237,217 | B2 | 6/2007 | Restle |
| 7,702,944 | B2 | 4/2010 | Chelstrom et al. |
| 8,339,209 | B2 | 12/2012 | Papaefthymiou et al. |

(Continued)

FOREIGN PATENT DOCUMENTS

WO    95/19659    7/1995

OTHER PUBLICATIONS

Non-final Office action in U.S. Appl. No. 13/601,155, dated Aug. 9, 2013, 15 pages.

(Continued)

*Primary Examiner* — Daniel Rojas
(74) *Attorney, Agent, or Firm* — Abel Law Group, LLP (57) ABSTRACT

A resonant clock network includes an inductor coupled to the clock network through a plurality of switches. When the clock network enters resonant mode, the turn-on of the switches to couple the inductor to the clock network is staggered. The clock network may be formed of multiple regions, each with its own inductor and switches. The turn-on of switches of each region may be staggered with respect to the turn-on off the switches of the other regions as well as to the turn-on of switches within a region. In addition to staggering the turn-on of the switches when entering the resonant mode, the switches may be turned off in a staggered manner when exiting the resonant mode of operation.

13 Claims, 8 Drawing Sheets

(56) References Cited

U.S. PATENT DOCUMENTS

| | | | |
|---|---|---|---|
| 8,362,811 | B2 | 1/2013 | Papaefthymiou et al. |
| 8,368,450 | B2 | 2/2013 | Papaefthymiou et al. |
| 8,400,192 | B2 | 3/2013 | Papaefthymiou et al. |
| 8,502,569 | B2 | 8/2013 | Papaefthymiou et al. |
| 2005/0057286 | A1 | 3/2005 | Shepard et al. |
| 2008/0303576 | A1 | 12/2008 | Chueh et al. |
| 2009/0027085 | A1 | 1/2009 | Ishii et al. |
| 2011/0084736 | A1 | 4/2011 | Papaefthymiou et al. |
| 2011/0084772 | A1 | 4/2011 | Papaefthymiou et al. |
| 2011/0084773 | A1 | 4/2011 | Papaefthymiou et al. |
| 2011/0084774 | A1* | 4/2011 | Papaefthymiou et al. ............ 331/117 FE |
| 2011/0084775 | A1 | 4/2011 | Papaefthymiou et al. |
| 2011/0090018 | A1 | 4/2011 | Papaefthymiou et al. |
| 2011/0090019 | A1 | 4/2011 | Papaefthymiou et al. |
| 2011/0140753 | A1 | 6/2011 | Papaefthymiou et al. |
| 2012/0306585 | A1* | 12/2012 | Mack ............................ 331/182 |
| 2013/0049824 | A1 | 2/2013 | Kim et al. |
| 2013/0154727 | A1 | 6/2013 | Guthaus |
| 2013/0194018 | A1 | 8/2013 | Papaefthymiou et al. |

OTHER PUBLICATIONS

Non-final Office action in U.S. Appl. No. 13/601,119, dated Nov. 13, 2013, 16 pages.

Non-final Office action in U.S. Appl. No. 13/601,138, dated May 28, 2013, 26 pages.

Non-final Office action in U.S. Appl. No. 13/601,175, dated Aug. 1, 2013, 15 pages.

Non-final Office action in U.S. Appl. No. 13/601,188, dated Aug. 6, 2013, 16 pages.

Final Office action in U.S. Appl. No. 13/601,188, dated Nov. 18, 2013, 16 pages.

Ikeuchi, Katsuyuki et al. "Switched Resonant Clocking (SRC) Scheme Enabling Dynamic Frequency Scaling and Low-Speed Test," IEEE 2009 Custom Integrated Circuits Conference (CICC) pp. 33-36.

Foreign Search Report in PCT/US2013/057331, dated Nov. 27, 2013, 14 pages.

Foreign Search Report in PCT/US2013/057614, dated Nov. 11, 2013, 12 pages.

U.S. Appl. No. 13/601,188, filed Aug. 31, 2012, entitled "Clock Driver for Frequency Scalable Systems," naming inventors Visvesh S. Sathe et al.

U.S. Appl. No. 13/601,175, filed Aug. 31, 2012, entitled "Programmable Clock Driver," naming inventors Visvesh S. Sathe et al.

U.S. Appl. No. 13/601,155, filed Aug. 31, 2012, entitled "Controlling Impedance of a Switch Using High Impedance Voltage Sources to Provide More Efficient Clocking," naming inventors Visvesh S. Sathe and Samuel Naffziger.

U.S. Appl. No. 13/601,119, filed Aug. 31, 2012, entitled "Constraining Clock Skew in a Resonant Clocked System," naming inventors Visvesh S. Sathe and Samuel Naffziger.

U.S. Appl. No. 13/601,138, filed Aug. 31, 2012, entitled "Transitioning from Resonant Clocking Mode to Conventional Clocking Mode," naming inventors Visvesh S. Sathe and Samuel Naffziger.

* cited by examiner

TRANSITIONING BETWEEN RESONANT CLOCKING MODE AND CONVENTIONAL CLOCKING MODE

CROSS-REFERENCE TO RELATED APPLICATION(S)

This application claims benefit to provisional application 61/695,702, filed Aug. 31, 2012, entitled "Transitioning Between Resonant Clocking Mode and Conventional Clocking Mode," which application is incorporated herein by reference in its entirety.

BACKGROUND

1. Technical Field

The disclosed embodiments relate to clock distribution networks in integrated circuits and more particularly to switching a resonant clock network from a resonant clocking mode to a conventional clocking mode.

2. Description of the Related Art

Clock distribution networks account for a significant portion of overall power consumption in most high performance digital circuits today due, at least in part, to the parasitic capacitance that is connected to the clock network. Reducing power consumption is of interest for most electronic circuits, particularly those for mobile applications. Resonant clocking is one approach to reduce power consumption associated with clock distribution networks. However, resonant clocking does not work well at all of the wide range of frequencies that may be utilized in many current microprocessor or other integrated circuit systems.

SUMMARY OF EMBODIMENTS

In some embodiments a method includes turning on a first plurality of switches to couple an inductor to a clock network in a staggered manner when switching the clock network into a resonant mode of operation.

In some embodiments a method includes turning off a plurality of switches that couple an inductor to a clock network in a staggered manner when switching the clock network out of a resonant mode of operation.

In some embodiments an integrated circuit includes an inductor and a first plurality of switches forming a first switch bank that selectively couples the inductor to a clock network. Control logic staggers turn-on of the switches when switching the clock network into a resonant mode of operation.

In some embodiments an integrated circuit includes an inductor and a plurality of switches that selectively couple the inductor to a clock network. Control logic is configured to stagger turn-off of the switches to connect the inductor to the clock network when switching the clock network out of a resonant mode of operation.

In some embodiments a non-transitory computer-readable medium stores a computer readable data structure encoding a functional description of an integrated circuit, the integrated circuit including an inductor and a first plurality of switches forming a first switch bank that selectively couples the inductor to a clock network. The integrated circuit further includes control logic configured to stagger turn-on of the switches when switching the clock network into a resonant mode of operation.

BRIEF DESCRIPTION OF THE DRAWINGS

The disclosed embodiments may be better understood, and its numerous objects, features, and advantages made apparent to those skilled in the art by referencing the accompanying drawings.

FIG. 5 shows example clock waveforms for an embodiment with a two-stage turn-on.

The use of the same reference symbols in different drawings indicates similar or identical items.

DETAILED DESCRIPTION

Figure 1A:
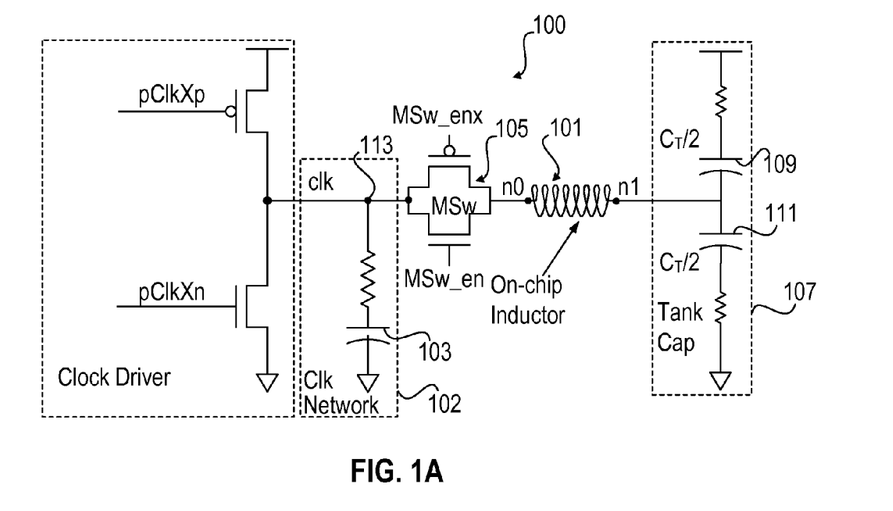
FIG. 1A illustrates an embodiment a resonant clock system, which supports both resonant and conventional clocking.

Clock distribution networks account for a significant portion of overall power consumption in most high performance digital circuits today due to the parasitic capacitance that is connected to the clock network. One technique to implement a more energy-efficient clock distribution is resonant clocking. FIG. 1A illustrates a simplified model of a resonant clock system 100, which supports both resonant and conventional clocking. A distinct feature of the resonant clock system 100 is the use of an inductor 101 that is connected in parallel with the parasitic capacitance 103 of the clock network 106, which forms a part of resonant clock system 100. The role of the clock driver is to replenish only the energy lost in the parasitic resistance of the LC system. Resonant clocking thus relies on efficient LC resonance to achieve energy efficiency. For an ideal inductor and interconnect, with no parasitic resistance, the clock network would oscillate with zero energy dissipation. Resonant clocking is most efficient at frequencies close to the resonant frequency.

Driving the resonant clock network at frequencies much lower than the resonant frequencies results in malformed clock waveforms that prevent correct operation of the processor.

Modern microprocessors and other integrated circuits operate over a frequency range that cannot be supported by a purely resonant clock network designed to resonate at a single frequency. In some embodiments that results in the use of a dual clock mode. At frequencies near the resonant frequency, the processor operates in the resonant clock mode. At frequencies outside the range where resonant clocking can be robustly operated, the processor works in the conventional mode. That may be done in some embodiments by using the mode switch 105 along the series path with the inductor as shown in FIG. 1A. The mode switch 105 (MSw) is closed during resonant operation (rclk) to couple the inductor to the clock network and open in conventional mode (cclk) so as to disconnect the inductor from the network. In some embodiments, the mode switch 105 (MSw) is located as shown in FIG. 1A. The capacitors 109 and 111 may be included to ensure that the n1 node of inductor 101 is connected to ground in an AC sense. That avoids a DC drop across the inductor (which would lead to current buildup) so that node n1 takes on the natural DC value of the clock signal, and at the same time provides a very low impedance at the resonant frequency so that the inductor 101 and the clock network capacitive load look like a parallel LC tank circuit, with the capacitors 109 and 111 appearing like ground connections.

Figure 1B:
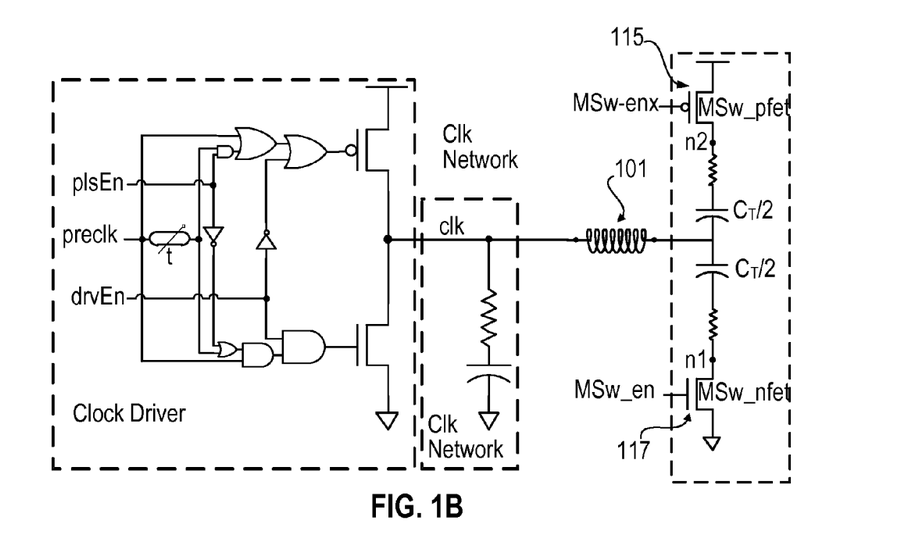
FIG. 1B illustrates an embodiment a resonant clock system, which supports both resonant and conventional clocking.

Although the mode switch 105 is shown in the embodiment of FIG. 1A to be placed between the clk node 113 and the inductor 101, a variety of other mode switch placements are possible including between the inductor 101 and the capacitor circuit 107, as well as in a header-footer configuration with mode switch formed by transistors 115 and 117, respectively between the power terminal and capacitor 109 and between capacitor 111 and the ground terminal as shown in FIG. 1B.

Figure 2:
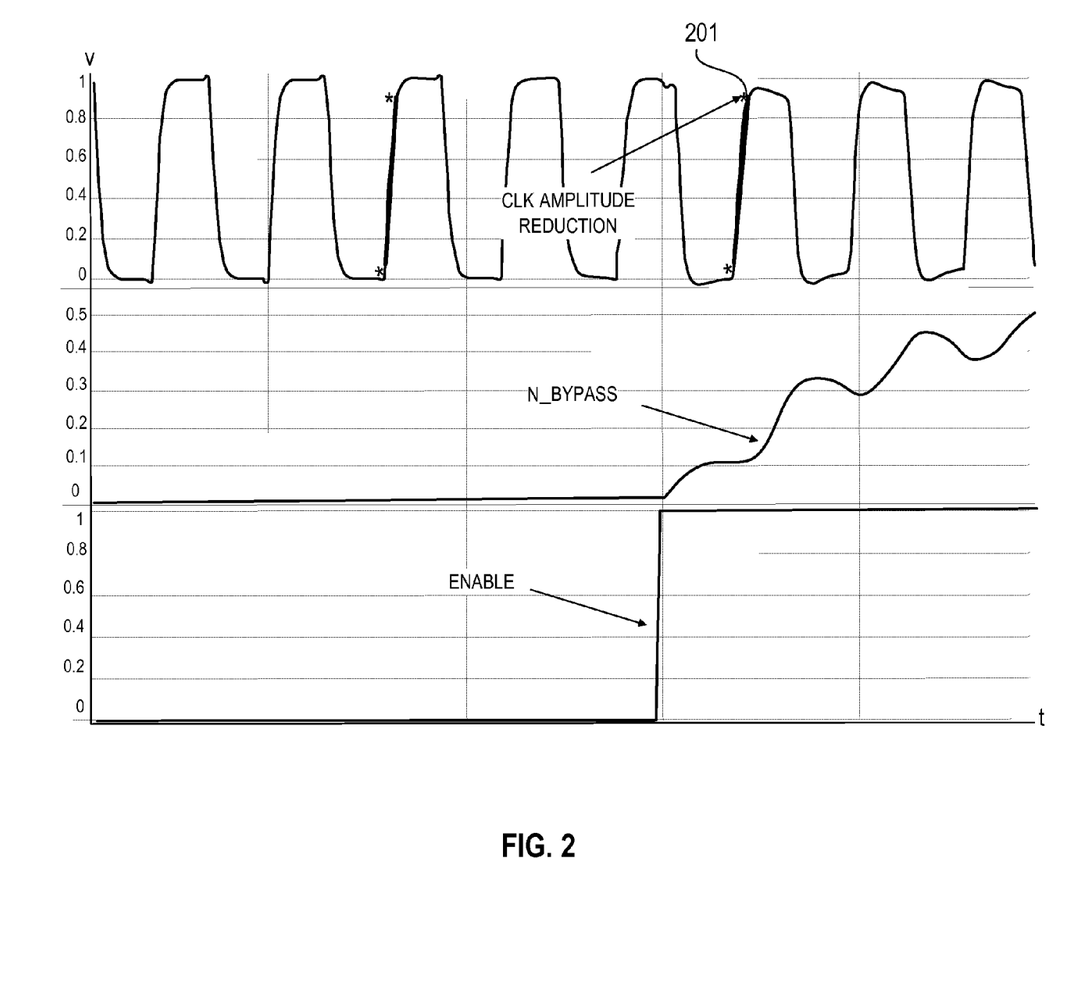
FIG. 2 illustrates example waveforms for associated with the embodiment of FIG. 1A.

FIG. 2 shows waveforms for the clk signal (in FIG. 1A), Msw enable signal, and n_bypass (n1 in FIG. 1A). The Msw enable signal indicates when to turn on (close) the pFET and nFET of the mode switch 105 using MSW_enx and MSW_en control signals shown in FIG. 1A. FIG. 2 shows the waveforms as the clock system in FIG. 1A transitions from conventional clock mode (where the mode switch 105 is open) to resonant clock mode (where the mode switch 105 closed). If the voltage on node n0 is not near VDD/2 (approximately half the clock signal (clk) peak), the closing of the MSw switch 105 results in a significant loading of the clock network 106. This abrupt loading of the clock network has a detrimental effect of the clock waveform as seen by the increase in the rise/fall time of the clock, and a reduction in clock amplitude at 201. That effect on the clock waveform can result in timing failure in the system. Furthermore, high current flow through the switch to charge the tank capacitor circuit 107 can have signal electro-migration implications, which impact the longevity of the part.

Regardless of the placement of the MSw switch, the transition between conventional mode and resonant mode results needs to be performed in a controlled fashion to avoid detrimental effects on the clock. Embodiments described herein avoid the abrupt loading of the clock network caused by charging of the capacitor circuit 107 by performing a controlled charging of the capacitor circuit 107 to the quiescent voltage of the clock.

Figure 3:
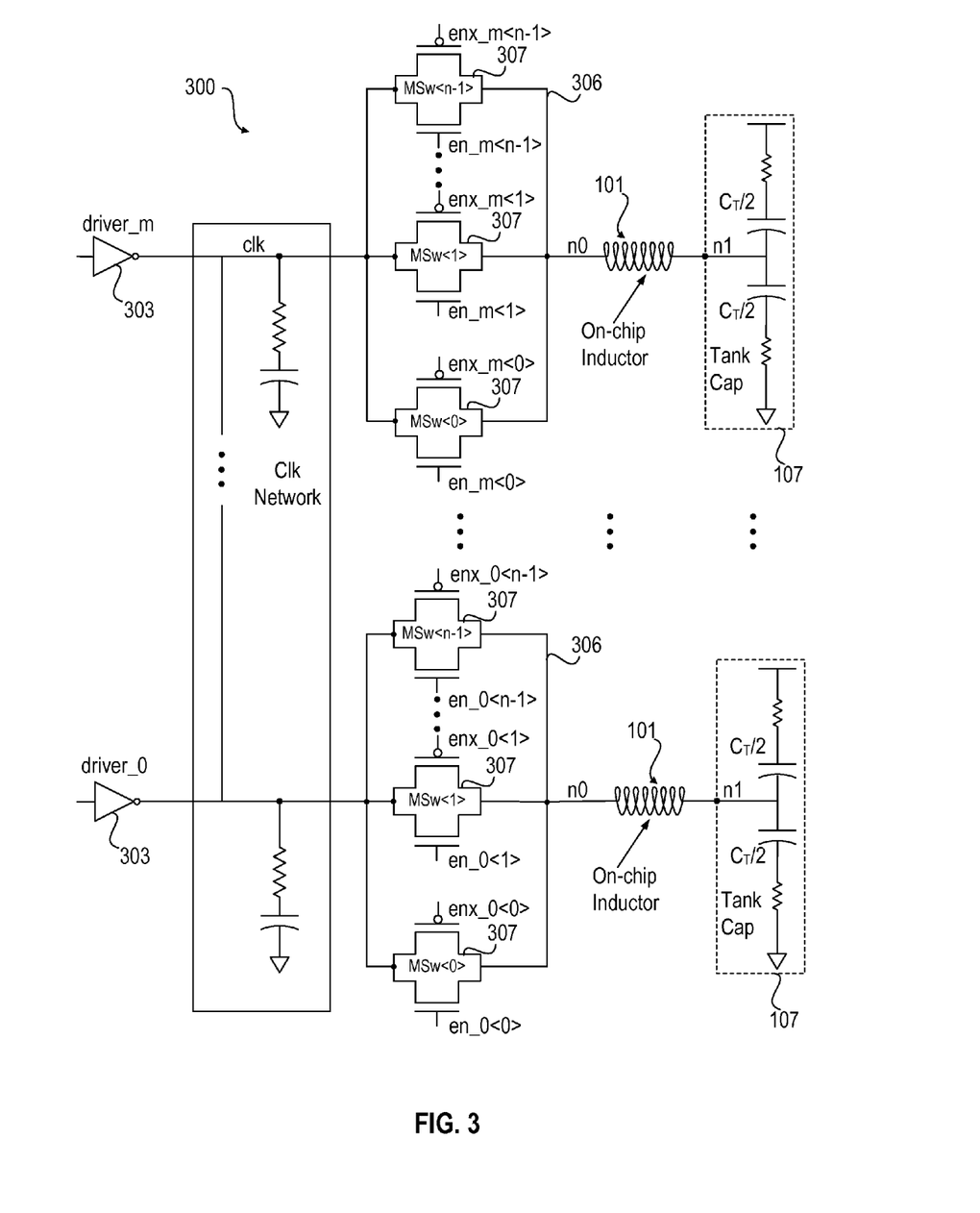
FIG. 3 illustrates an embodiment of a resonant clock system with multiple clock drivers driving the clock network and multiple inductors connected to the clock network.

FIG. 3 illustrates a simplified high level diagram of an embodiment of a resonant clock system 300 with multiple clock drivers 303 driving the clock network and multiple inductors 101 connected to the clock network. The resonant clock system 300 is typically distributed all over the core and is driven by multiple drivers. In embodiments, each region of the clock network that is serviced by a driver and/or inductor can be considered to be a clock domain. The clock network is made up of several such individual but connected clock domains.

In some embodiments, assume (without loss of generality) that the clock load is divided into m clock domains tightly connected together through the clock network such that they oscillate at the same frequency. For simplicity, assume that each domain is driven by a driver and has an inductor connected to the domain. A cause of the deformation in the clock waveform is the sudden loading of the network with the capacitor circuit 107. One solution to the problem of sudden loading is to allow a more gradual charging of the capacitor circuit 107, thereby reducing the current demand on the network. By implementing a plurality of mode (MSw) switches per inductor to form switch banks 306, and controlling turning on both the switches 307 within a switch bank 306, the inductors can be turned on in a manner that does not degrade the clock waveform by staggering the turn-on of individual ones of the switches 307 within the switch bank 306. In addition, turning on the different switch banks 306 over the domain can be staggered to further help avoid degrading the clock waveform.

Figure 4A:
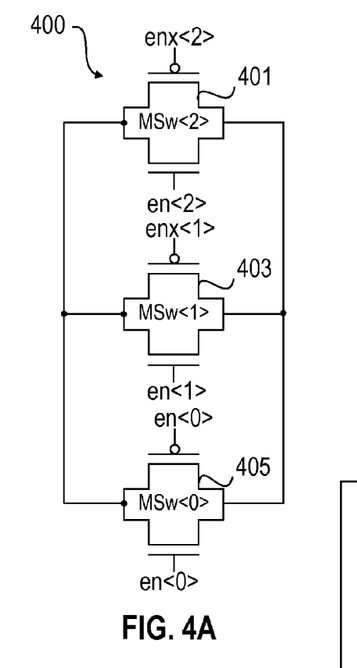
FIG. 4A shows an example of a switch bank according to an embodiment.

FIG. 4A shows an example of a switch bank 400 where single mode switch such as mode switch 105 is implemented as three parallel switches 401, 403, and 405 (n=3), which are turned on in a manner to allow a gradual turn-on of resonant mode.

Figure 4B:
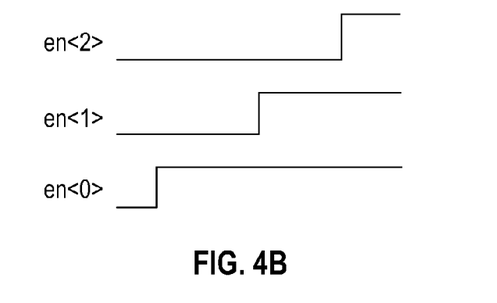
FIG. 4B shows example timing of assertion of the control signals associated with the switch bank of FIG. 4A.
Figure 4C:
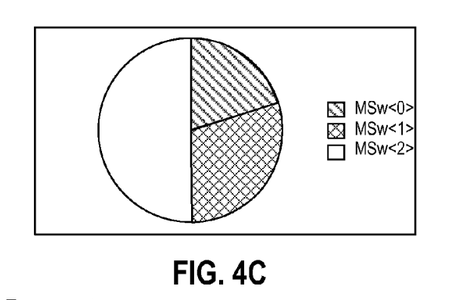
FIG. 4C illustrates an example of the portion of the switch bank 400 allocated to each switch in the switch bank.

FIG. 4B shows example timing of the assertion of the control signals for each of the switches 401, 403, and 405, to turn on the switches for the case of n=3, with en<0> being asserted first, en<1> second and en<2> last. Note that while FIG. 4B shows the enable signals en<0>, en<1>, and en<2> for ease of illustration rather than the control signals MSW_en and MSW_enx for nFET and pFET devices of each switch, the switch control signals for pFET and nFET devices of each switch are staggered as shown for en<0>, en<1>, and en<2>. Thus, switch 405 turns on in response to the assertion of en<0>, switch 403 turns on in response to the assertion of en<1>, and switch 401 turns on in response to en<2>. The exact relative drive strength allocation amongst the switches in the switch bank 400 can be optimized based on the electro-migration limits and the relative times at which the switches are enabled. FIG. 4C illustrates an example of the portion of the switch bank 400 allocated to each switch in the switch bank. The exact relative drive strength allocation amongst the switches 401 in the switch bank 400 can be optimized based on the electro-migration limits and the relative times at which the switches are enabled. The timing and number of switches are examples and various embodiments can have timing, number of switches, and drive strengths determined according to the needs of the particular clocking system.

Figure 4D:
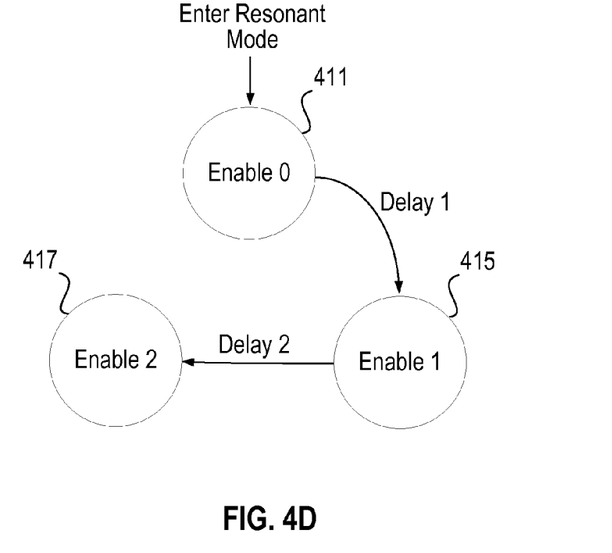
FIG. 4D illustrates example control logic to enable a switch bank.

FIG. 4D illustrates example control logic (a state machine) to enable the switch bank 400 by generating the control signals shown in FIG. 4B. On receipt of a control signal to enter resonant mode, the control signal en<0> is asserted in 411 to turn on switch MSw<0>. After a first delay time (delay 1) a second state 415 is entered in which the control signal en<1> is asserted to turn on switch MSw<1>. After a second delay (delay 2) the state machine enters a third state 417 in which the control signal en<2> is asserted to turn on MSw<2>. When all the switches are turned on, the inductor is fully connected to the clock network. The delays between states may be implemented using counters or some other timing mechanism. The delays may be the same or of different lengths. While FIG. 4D shows one type of control circuit, other control approaches may be utilized.

Figure 5:
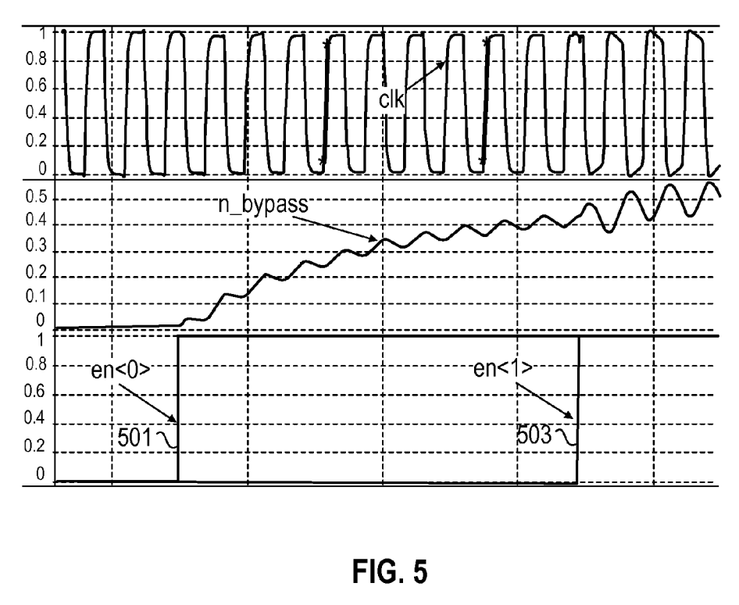

FIG. 5 shows example clock waveforms for clk, n_bypass (n1 in FIG. 1) and MSw enable signals obtained using a two-stage turn-on solution (n=2). As shown in FIG. 5, the first enable occurs at 501 and the second enable occurs at 503. As can be seen in the clock waveform, unlike FIG. 2, there is no clock amplitude reduction caused by enabling resonant mode.

Some embodiments use a bank of switches to gradually reduce the MSw resistance to control the current flow out of the network into the capacitor circuit 107. In general however, other techniques that allow such a gradual transition, such as controlling the gate voltage of the mode (MSw) switch to gradually turn on the mode switch (MSw) may also yield similar results.

Figure 6A:
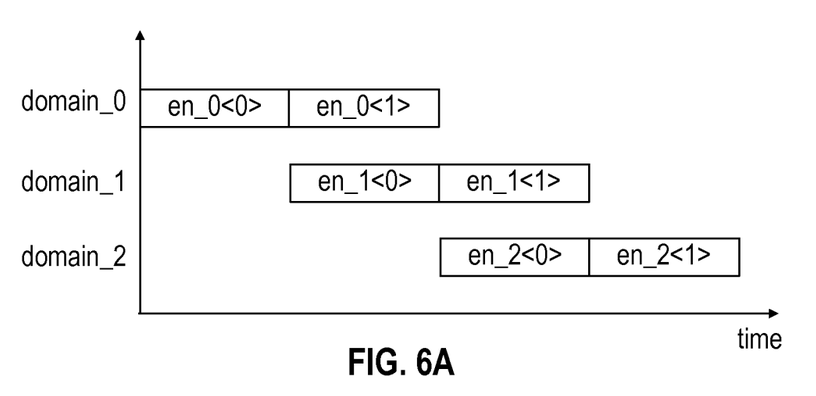
FIG. 6A illustrates example control signals for gradual turn-on for an embodiment of a clock network with three clock domains.
Figure 6B:
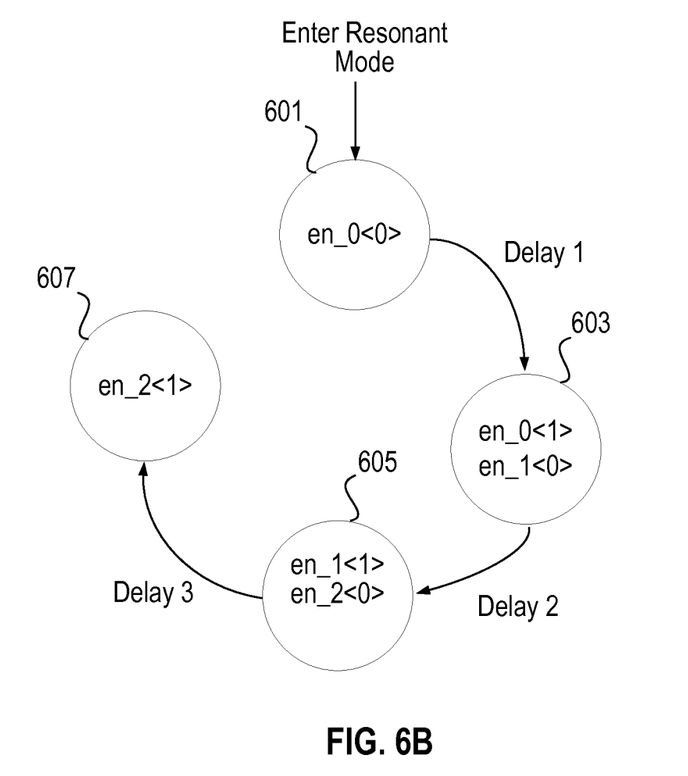
FIG. 6B illustrates example control logic for gradual turn-on for an embodiment of a clock network with three clock domains.

Embodiments can extend the idea of a staggered turn-on of the MSw switch, by generalizing the gradual turn on in a full-core context as well. Thus, some embodiments can stagger not only the switch bank that makes up the MSw (as illustrated by, e.g., FIGS. 4A and 4B), but also stagger the turn on of each of the MSw switch in each of the m domains shown in FIG. 3. By staggering the time that the capacitor circuits 107 load the network, the charge required by all the capacitive circuits 107 is spread out over time, reducing current draw from the network, and reducing the impact on the clock signal. FIG. 6A illustrates an example control signals for gradual turn-on solution for a clock network with three clock domains where each MSw switch has 2 switches (the case of m=3, n=2). FIG. 6B illustrates example control logic (a state machine) to enable the switch banks of three domains by generating the control signals shown in FIG. 6A. On receipt of a control signal to enter resonant mode, the control signal en_0<0> is enabled or asserted in state 601 to turn on switch MSw<0> in bank 0. After a first delay time (delay 1) the state machine enters a second state 603 in which the control signals en_0<1> and en_1<0> are asserted in to turn on (enable), respectively, switch MSw<1> in bank 0 and switch MSw<0> in bank 1. After a second delay (delay 2), the state machine enters a third state 605 in which the control signals en_1<1> and en_2<0> are asserted in to turn on (enable), respectively, switch MSw<1> in bank 1 and switch MSw<0> in bank 2. After a third delay the state machine enters a fourth state 607 in which the control signal en_2<1> is asserted in to turn on (enable) MSw<1> in bank 2. Note that the various delays may be implemented using counters or some other timing mechanism. The delays may be the same or of different lengths. While FIG. 6B shows one type of control circuit, other control approaches may be utilized.

Embodiments described herein allow a resonant clocked system to transition between conventional clocking and resonant clocking without compromising the clock signal, thereby avoiding performance degradation.

In addition to the problems associated with converting to resonant clocking mode of operation from the conventional clocking mode of operation, converting from the resonant clocking mode of operation to the non-resonant clocking mode of operation poses significant challenges. Referring again to FIG. 1A, if the mode switch 105 is opened to transition to the non-resonant mode of operation at a time when the inductor 101 does not have zero, or near-zero current flow through it, the opening of the mode switch 105 causes a sharp overshoot in the voltage at the junction between the mode switch 105 and the inductor 101 at node n0 in FIG. 1A.

Figure 7:
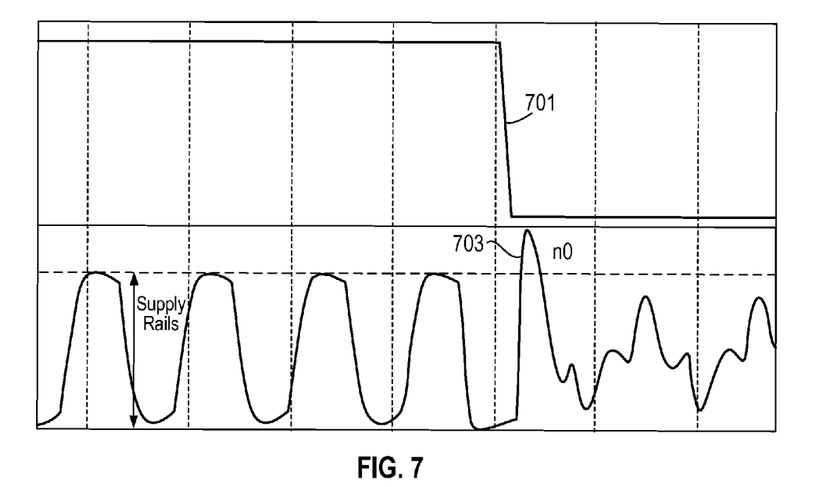
FIG. 7 illustrates a voltage overshoot that may occur when exiting resonant mode.

FIG. 7 illustrates the voltage overshoot that may occur at node n0 (in FIG. 1A) when the MSW_en and MSW_enx control signals supplied to the gate terminals of the transistors of the mode switch 105 are deasserted at 701, opening the mode switch 105 and disconnecting the inductor 101 from the clock network 102. Note that FIG. 7 shows only the deassertion of MSW_en. The resulting overshoot 703 at node n0 often exceeds the voltage supply rails and poses a reliability threat to the operation of the mode switch 105 due to high gate-oxide stress between the gate and drain terminals.

While the problem of voltage overshoot was described in the context of the embodiment illustrated in FIG. 1A, the problem exists with other series-connected mode switch variants such as the embodiment illustrated in FIG. 1B. In FIG. 1B, the voltage at the nodes n1 and n2 (between the transistors 115 and 117 and the capacitors) causes similar reliability concerns due to potential voltage overshoot.

One way to deal with the voltage overshoot is to ensure that the mode switch opens at the time that the inductor current is at or near zero. That solution, however, is difficult to implement robustly and is substantially complicated for a system where the supply voltage varies during the course of operation of the system. Designing a system that ensures that the gate signals of the mode switch transition at the instant that the current flow is zero requires a feedback-based system which significantly complicates the design.

Figure 8:
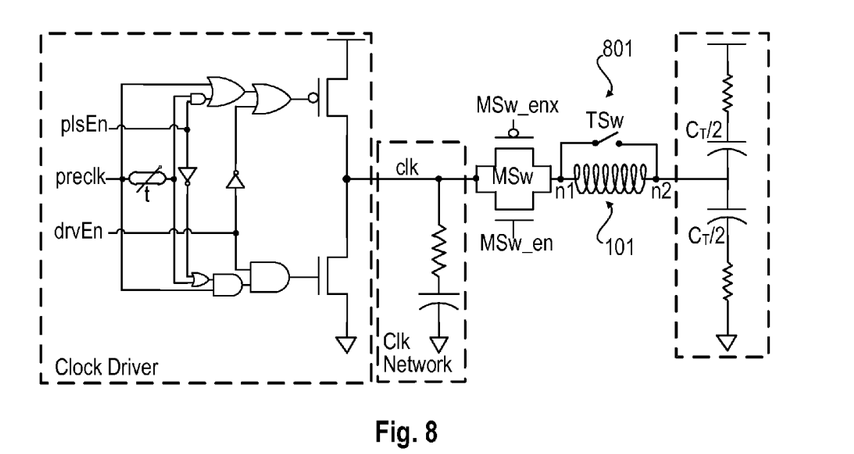
FIG. 8 illustrates an embodiment having a throttle switch connected in parallel with the inductor to address reliability concerns that may be caused by turning off the mode switch.

In some embodiments, and referring to FIG. 8, a throttle switch 801 (TSw) is connected in parallel with the inductor 101 to address reliability concerns caused by the ill-timed turning off of the mode switch. The throttle switch 801 is open during resonant clocking mode, and is closed at the same time that the mode switch 105 opens. By closing the throttle switch 801 at the same time that the mode switch opens, the current in the inductor that decays gradually no longer sees a high impedance (which causes the overshoot) and instead has a low impedance path to circulate through the throttle switch and back around through the inductor.

Figure 9:
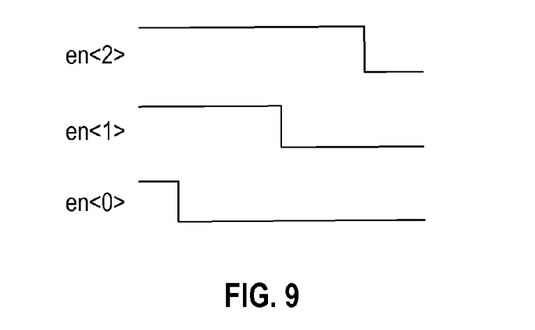
FIG. 9 illustrates an embodiment in which the turn-off of the enable signals are staggered to gradually turn off resonant mode.

However, rather than add the throttle switch 801, some embodiments can use the control that gradually turns on the banks of switches constituting a mode switch to gradually turn off the mode switch. Thus, as shown in FIG. 9, the turn-off of the enable signals can be staggered to gradually turn off resonant mode, e.g., for the switch banks of FIGS. 3 and 4. First en<0> is deasserted to turn off the corresponding switch, then en<1>, and finally en<2> is deasserted to turn off the corresponding switch, thereby avoiding the overshoot shown in FIG. 7.

Figure 10:
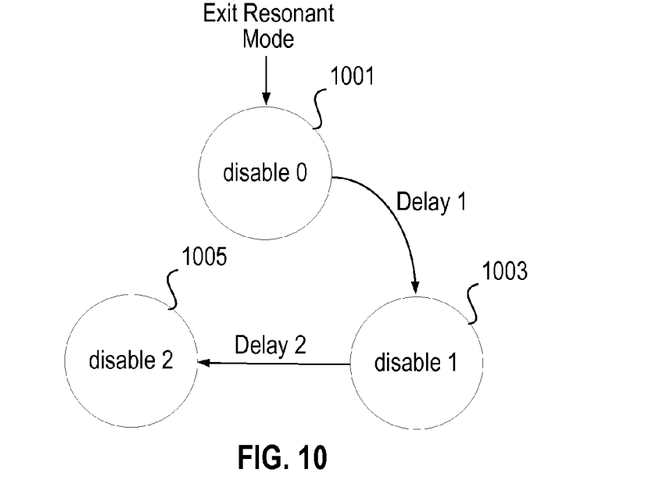
FIG. 10 illustrates example control logic to disable (turn-off) the switches of a switch bank in an embodiment when exiting resonant mode.

FIG. 10 illustrates example control logic (a state machine) to disable the switch bank 400 (FIG. 4A) by generating the control signals shown in FIG. 9. On receipt of a control signal to exit resonant mode, the control signal en<0> is deasserted in 1001 to turn off switch MSw<0>. After a first delay time (delay 1) a second state 1003 is entered in which the control signal en<1> is deasserted to turn off switch MSw<1>. After a second delay (delay 2) a third state 1005 is entered in which the control signal en<2> is deasserted to turn off switch MSw<2>. The delays may be implemented using counters or some other timing mechanism. The delays may be the same or different. While FIG. 10 shows one type of control circuit, other control approaches may be utilized. Note that the asserting sequence shown in FIG. 4C can be different than the deasserting sequence shown in FIG. 10, and the timing and order of assertion and deassertion of the control signals can be determined independently. Note also that the size of the transistors forming the switches of a switch bank may vary allowing a switch of the switch bank to carry different amounts of current than another switch of the switch bank.

Figure 11:
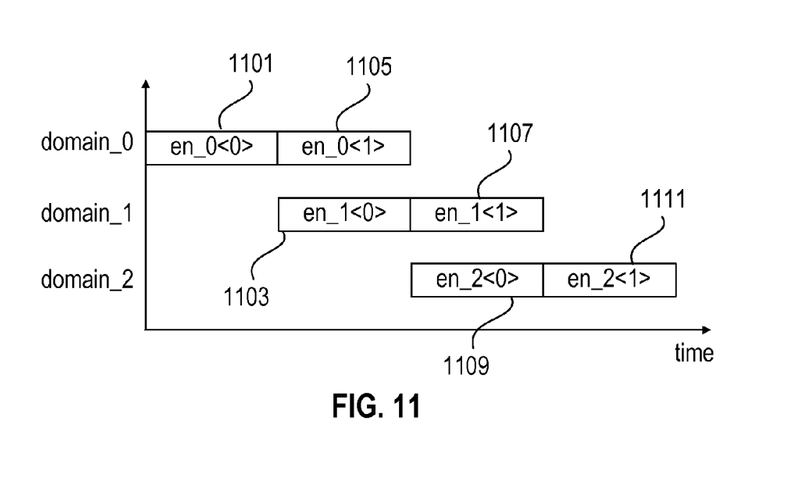
FIG. 11 illustrates an embodiment providing a gradual turn-off solution for a clock network with multiple clock domains.

Similarly, a more global approach can be taken and some embodiments can extend the idea of a staggered turn-off of the MSw switch, by generalizing the gradual turn off in a full-core context as well. Thus, some embodiments can stagger turn-off not of only the switch bank that makes up the MSw (as shown in FIGS. 4A, 4B, and 4C), but also stagger the turn-off of each of the MSw switches in each of the m domains shown in FIG. 3. FIG. 11 illustrates an example gradual turn-off solution for a clock network with three clock domains where each MSw switch has 2 switches (the case of m=3, n=2). At 1101 en_0<0> of domain 0 is turned off. At 1105 en_0<1> is turned off along with en_1<0> at 1107. At 1107 en_1<1> is turned off along with en_2<0> at 1109. Finally, at 1111 en_2<1> is turned off. The approach of FIG. 11 staggers the turn off of both the domains and the individual switches within switch banks of each domain.

Thus, embodiments described herein address the reliability concerns due to a possible voltage overshoot when the clock system transitions from a resonant clocking mode to a conventional non-resonant clocking mode.

While circuits and physical structures have been generally presumed in describing embodiments herein, it is well recognized that in modern semiconductor design and fabrication, physical structures and circuits may be embodied in a computer readable medium as data structures for use in subsequent design, simulation, test, or fabrication stages. For example, such data structures may encode a functional description of circuits or systems of circuits. The functionally descriptive data structures may be, e.g., encoded in a register transfer language (RTL), a hardware description language (HDL), in Verilog, or some other language used for design, simulation, and/or test. Data structures corresponding to embodiments described herein may also be encoded in, e.g., Graphic Database System II (GDSII) data, and functionally describe integrated circuit layout and/or information for photo-mask generation used to manufacture the integrated circuits. Other data structures, containing functionally descriptive aspects of embodiments described herein, may be used for one or more steps of the manufacturing process.

Computer-readable media include tangible computer readable media, e.g., a disk, tape, or other magnetic, optical, or electronic storage medium. In addition to computer-readable medium having encodings thereon of circuits, systems, and methods, the computer readable media may store instructions as well as data that can be used to implement embodiments described herein or portions thereof. The data structures may be utilized by software executing on one or more processors, firmware executing on hardware, or by a combination of software, firmware, and hardware, as part of the design, simulation, test, or fabrication stages.

The description of the embodiments set forth herein is illustrative, and is not intended to limit the scope of the following claims. For example, embodiments are not limited in scope to microprocessors. Rather, the solution described herein applies to integrated circuits in general. Other variations and modifications of the embodiments disclosed herein may be made based on the description set forth herein, without departing from the scope of the following claims.

What is claimed is:

1. A method comprising:
turning on a first plurality of switches to couple an inductor to a clock network in a staggered manner when switching the clock network into a resonant mode of operation, the turning on in a staggered manner including turning on a first and second transistor in a first switch of the first plurality of switches to turn on the first switch and after a delay from the first switch being turned on, turning on a third and a fourth transistor in a second switch to turn on the second switch.

2. The method as recited in claim 1, further comprising:
turning on a second plurality of switches coupling a second inductor to the clock network, in a staggered manner when switching the clock network into the resonant mode of operation, wherein each of the second plurality of switches include a first and second transitor.

3. The method as recited in 2 further comprising staggering the turn on of the first plurality of switches with respect to the turn on of the second plurality of switches.

4. The method as recited in claim 1 further comprising:
turning off the first plurality of switches that couple the inductor to the clock network in a staggered manner to disconnect the inductor from the clock network when switching the clock network out of the resonant mode of operation, the turning off including turning off one of the first and second switches and after a delay turning off the other of the first and second switches.

5. A method comprising:
turning on a first plurality of switches to couple an inductor to a clock network in a staggered manner when switching the clock network into a resonant mode of operation;
turning off the first plurality of switches that couple the inductor to the clock network in a staggered manner to disconnect the inductor from the clock network when switching the clock network out of the resonant mode of operation;
wherein the staggered manner to couple the inductor to the clock network differs from the staggered manner to disconnect the inductor from the clock network in at least timing or order of turning on or turning off the first plurality of switches.

6. An integrated circuit comprising:
an inductor;
a first plurality of switches forming a first switch bank that selectively couples the inductor to a clock network, each of the first plurality of switches being a transmission gate including a p-channel transistor and an n-channel transistor;
control logic configured to stagger turn-on of the first plurality of switches when switching the clock network into a resonant mode of operation, wherein the staggered turn-on of the first plurality of switches turns on the p-channel transistor and the n-channel transistor in a first switch of the first plurality of switches before turning on any transistors in a second switch of the first plurality of switches; and
control logic configured to stagger turn-off of the first plurality of switches when disconnecting the inductor from the clock network to exit the resonant mode of operation, wherein staggered turn-off of the first plurality of switches turns off the p-channel transistor and n-channel transistor in one of the first plurality of switches before turning off any transistors in another switch of the first plurality of switches.

7. The apparatus as recited in claim 6 wherein the staggered turn-on to couple the inductor to the clock network differs from the staggered turn-off to disconnect the inductor from the clock network in at least timing or order of turning on or turning off the first plurality of switches.

8. The integrated circuit as recited in claim 6 further comprising:
a second switch bank including a second plurality of switches coupling a second inductor to the clock network;
wherein the control logic is further configured to stagger turn-on of the first switch bank with respect to the second switch bank.

9. The integrated circuit as recited in claim 8 wherein turn-on of at least one of the first plurality of switches and at least one of the second plurality of switches overlap.

10. The integrated circuit as recited in claim 6 wherein the clock network comprises a plurality of clock domains and wherein each clock domain includes an inductor and a switch bank coupling the inductor to a respective one of the clock domains.

11. The integrated circuit as recited in claim 6 wherein a size of a first transistor used in the first switch of the first plurality of switches differs from a size of a second transistor used in the second switch of the first plurality of switches allowing the first switch to carry a different amount of current than the second switch.

12. A non-transitory computer-readable medium storing a computer readable data structure encoding a functional description of an integrated circuit, the integrated circuit comprising:
   an inductor;
   a first plurality of switches forming a first switch bank that selectively couples the inductor to a clock network, each of the switches including a first and a second transistor;
   control logic configured to stagger turn-on of the switches when switching the clock network into a resonant mode of operation, wherein the staggered turn-on of the first plurality of switches turns on the first and second transistors in a first switch of the first plurality of switches before turning on any transistors in a second switch of the first plurality of switches; and
   control logic configured to stagger turn-off of the first plurality of switches when disconnecting the inductor from the clock network to exit the resonant mode of operation, wherein staggered turn-off of the first plurality of switches turns off the first transistor and the second transistor in one of the first plurality of switches before turning off any transistors in another switch of the first plurality of switches.

13. The non-transitory computer-readable medium as recited in claim 12 wherein the staggered turn-on to couple the inductor to the clock network differs from the staggered turn-off to disconnect the inductor from the clock network in at least timing or order of turning on or turning off the first plurality of switches.

* * * * *

UNITED STATES PATENT AND TRADEMARK OFFICE
CERTIFICATE OF CORRECTION

PATENT NO.       : 8,941,432 B2
APPLICATION NO.  : 13/963300
DATED            : January 27, 2015
INVENTOR(S)      : Visvesh S. Sathe et al.

Page 1 of 1

It is certified that error appears in the above-identified patent and that said Letters Patent is hereby corrected as shown below:

On the title page, item (57), in the Abstract, line 7, please replace "off" with --of--;

In the Claims

Col. 8, line 7, in claim 3, line 1, please insert --claim-- before "2".

Signed and Sealed this
Second Day of June, 2015

Michelle K. Lee
*Director of the United States Patent and Trademark Office*